United States Patent
Jeong (10) Patent No.: US 8,836,410 B2
(45) Date of Patent: Sep. 16, 2014

(54) INTERNAL VOLTAGE COMPENSATION CIRCUIT

(75) Inventor: Bong Hwa Jeong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1019 days.

(21) Appl. No.: 12/215,794

(22) Filed: Jun. 30, 2008

(65) Prior Publication Data

US 2009/0051419 A1 Feb. 26, 2009

(30) Foreign Application Priority Data

Aug. 20, 2007 (KR) .......................... 10-2007-0083697
Jan. 21, 2008 (KR) .......................... 10-2008-0006371

(51) Int. Cl.
*G11C 5/14* (2006.01)
*G11C 11/4074* (2006.01)

(52) U.S. Cl.
CPC ............ *G11C 11/4074* (2013.01); *G11C 5/143* (2013.01); *G11C 5/147* (2013.01)
USPC ........................................................ 327/530

(58) Field of Classification Search
CPC ................................ G11C 5/147; G05F 1/465
USPC ......... 327/530, 534, 535, 537, 538, 540, 541, 327/63, 68, 69, 70, 99, 407; 307/80, 81
See application file for complete search history.

(56) References Cited

U.S. PATENT DOCUMENTS

| | | | | |
|---|---|---|---|---|
| 5,448,199 A | * | 9/1995 | Park | 327/546 |
| 5,953,279 A | * | 9/1999 | Kim et al. | 365/225.7 |
| 6,194,887 B1 | * | 2/2001 | Tsukada | 323/315 |
| 7,095,272 B2 | * | 8/2006 | Morishita | 327/541 |
| 7,397,298 B2 | * | 7/2008 | Tsukude | 327/535 |
| 7,474,143 B2 | * | 1/2009 | Sato et al. | 327/541 |
| 2006/0181334 A1 | * | 8/2006 | Do | 327/538 |
| 2008/0055991 A1 | | 3/2008 | Kim et al. | |

FOREIGN PATENT DOCUMENTS

KR 10-0172242 B1 10/1998
KR 10-2002-0068598 A 8/2002

* cited by examiner

*Primary Examiner* — Lincoln Donovan
*Assistant Examiner* — Sibin Chen
(74) *Attorney, Agent, or Firm* — John P. White; Cooper & Dunham LLP

(57) ABSTRACT

An internal voltage compensation circuit is provided which includes a power up signal generator configured to generate a power up signal, a select signal generator configured to compare a level of a first external voltage with a level of a second external voltage to generate first and second select signals, wherein the second select signal is generated in response to the power up signal, and a voltage compensation unit configured to electrically connect an internal voltage to the first external voltage or the second external voltage in response to the first and second select signals.

7 Claims, 9 Drawing Sheets

INTERNAL VOLTAGE COMPENSATION CIRCUIT

BACKGROUND

The present disclosure relates to a semiconductor memory device, and more particularly to an internal voltage compensation circuit, capable of adjustably compensating for the level of an internal voltage corresponding to two different external voltages in a power up section.

Generally, a power up signal generating circuit of a semiconductor device has a function of initializing the semiconductor device. Meanwhile, in order to operate the semiconductor device, an external voltage VDD is supplied to the semiconductor device from an external device. The level of the external voltage VDD is increased from 0[V] to a target voltage level with a predetermined slope. In this case, if all circuits of the semiconductor device are directly supplied with the external voltage VDD, the circuits may operate erroneously due to the influence of the rising external voltage. Accordingly, in order to prevent the circuits from erroneously operating, the semiconductor device employs the power up signal generating circuit and enables a power up signal, such that the external voltage VDD is supplied to the circuits after the external voltage VDD becomes a stable level. The semiconductor device is initialized through the above power up operation.

Meanwhile, in order to turn on an NMOS transistor mainly employed in a DRAM memory cell, a voltage higher than a source voltage by at least a threshold voltage Vt must be applied to a gate. However, generally, since the maximum voltage applied to the DRAM has the level of the external voltage VDD, a boosted voltage exceeding "external voltage VDD+Vt" must be applied to the gate of the NMOS transistor in order to read or write the external voltage VDD from or to a cell or a bit line. Accordingly, a high voltage VPP is generated by pumping the external voltage VDD.

However, if the level of the high voltage VPP is lower than the level of the external voltage VDD, the pumping operation for the high voltage VPP may be insufficiently performed. Accordingly, before the level of the external voltage VDD is increased to the level of the target voltage, that is, in a power up section, the high voltage VPP is electrically connected to the external voltage VDD such that the level of the high voltage VPP is increased corresponding to the level of the external voltage VDD.

Figure 1:
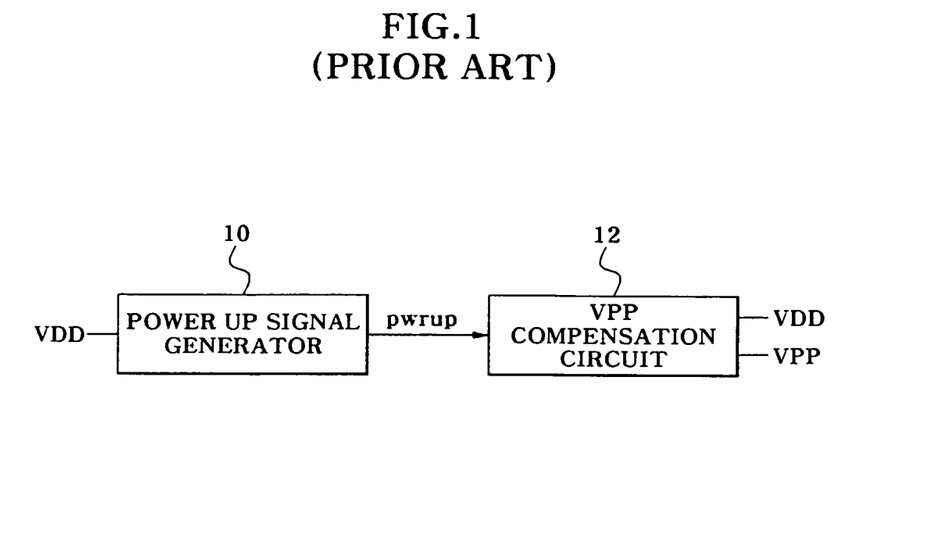
FIG. 1 is a block diagram showing the structure of a conventional high voltage compensation circuit.

FIG. 1 is a block diagram showing a conventional high voltage compensation circuit.

As shown in FIG. 1, the conventional high voltage compensation circuit includes a power up signal generator 10 and a high voltage compensation unit 12. The power up signal generator 10 generates a power up signal pwrup. The high voltage compensation unit 12 electrically connects a high voltage VPP to an external voltage VDD in response to the power up signal pwrup.

The power up signal generator 10 generates a power up signal pwrup which rises corresponding to the level of the external voltage VDD before the level of the external voltage VDD reaches the level of a target voltage, that is, during a power up section. The power up signal pwrup shifts from the high level to a low level, after the level of the external voltage VDD reaches the level of the target voltage. Such a power up signal pwrup is input into the high voltage compensation unit 12 so that the high voltage VPP is electrically connected to the external voltage during the power up section. Accordingly, the level of the high voltage VPP increases corresponding to the level of the external voltage VDD. Then, after the level of the external voltage VDD reaches the level of the target voltage, the high voltage VPP is electrically disconnected from the external voltage VDD, and the high voltage VPP is pumped through a high voltage pumping circuit (not shown).

Figure 2:
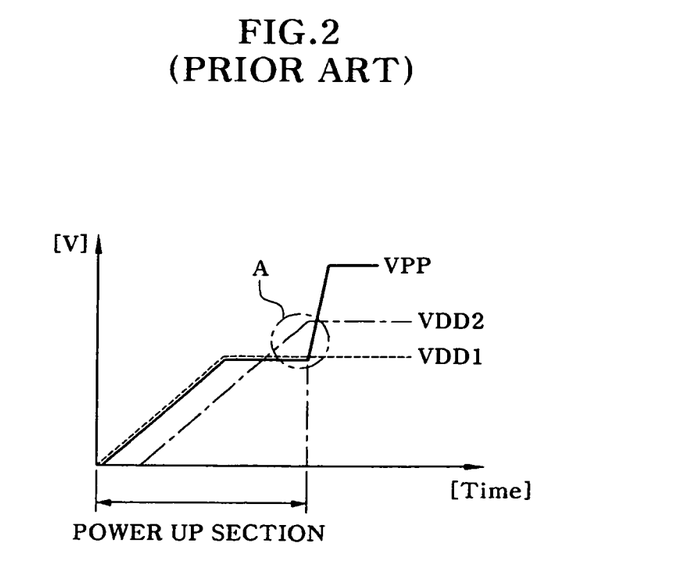
FIGS. 2 and 3 are graph showing the waveforms of internal signals of FIG. 1.
Figure 3:
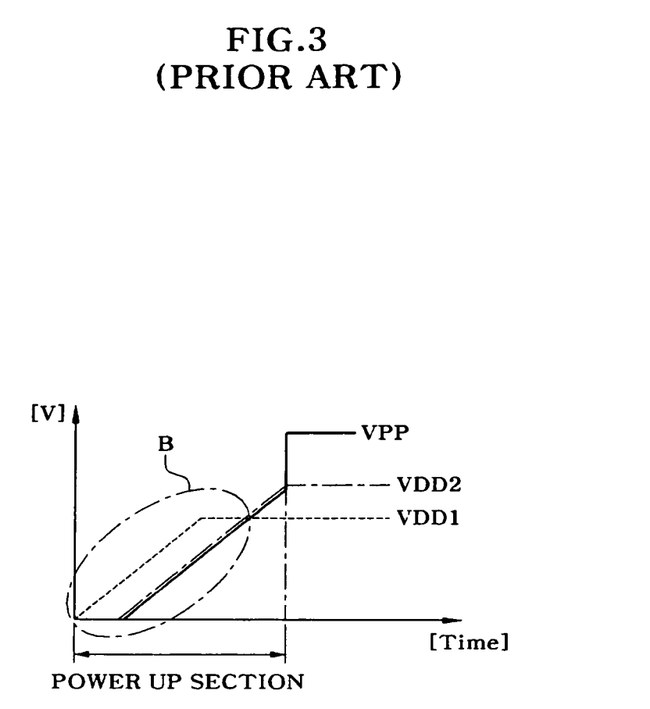

The conventional high voltage compensation circuit can adjustably compensate for the level of the high voltage VPP in the power up section when a single-type external voltage VDD is input. However, if first and second external voltages VDD1 and VDD2 having different types are input, the conventional high voltage compensation circuit cannot properly deal with the external voltages. In other words, as shown in FIG. 2, when the high voltage VPP is electrically connected to the first external voltage VDD1 in a power up section, the level of the high voltage VPP becomes lower than the level of the second external voltage VDD2 in a section A. In addition, when the high voltage VPP is electrically connected to the second external voltage VDD2, the level of the high voltage VPP becomes lower than the level of the first external voltage VDD1 in a section B. When the level of the high voltage VPP is lower than the level of the first external voltage VDD1 or the level of the second external voltage VDD2, latch up may occur.

SUMMARY

In an aspect of the present disclosure, an internal voltage compensation circuit is provided which is capable of preventing the level of an internal voltage from being lowered as compared with the level of an external voltage by electrically connecting a high voltage VPP to an external voltage having the largest level among a plurality of external voltages in a power up section when the external voltages are applied.

In an embodiment, an internal voltage compensation circuit includes a power up signal generator configured to generate a power up signal, a select signal generator configured to compare a level of a first external voltage with a level of a second external voltage to generate first and second select signals, wherein the second select signal is generated in response to the power up signal, and a voltage compensation unit configured to electrically connect an internal voltage to the first external voltage or the second external voltage in response to the first and second select signals.

In another embodiment, the power up signal generator generates the power up signal in response to a level of the first external voltage or the second external voltage.

In another embodiment, the select signal generator includes a comparator configured to compare the first external voltage with the second external voltage to generate a comparison signal, a level shifter configured to level-shift the comparison signal to generate the first select signal, and a logic unit configured to receive the power up signal and the first select signal and perform a logical operation with respect to the power up signal and the first select signal to generate the second select signal.

In another embodiment, the comparator includes a first voltage divider configured to divide the first external voltage, a second voltage divider configured to divide the second external voltage, and a differential amplifier configured to differentially amplify output signals of the first and second voltage dividers to generate the comparison signal.

In another embodiment, the first voltage divider includes a first resistor element connected between a first external voltage stage and a first node, and a second resistor element connected between the first node and a ground terminal.

In another embodiment, the second voltage divider includes a first resistor element connected between a second external voltage stage and a first node, and a second resistor element connected between the first node and a ground terminal.

In another embodiment, the level shifter includes a first pull-down unit configured to pull-down drive a first node in response to the comparison signal, a second pull-down unit configured to pull-down drive the first select signal in response to the comparison signal, a first pull-up unit configured to pull-up drive the first node in response to the first select signal, and a second pull-up unit configured to pull-up drive the first select signal in response to a signal of the first node.

In another embodiment, the logic unit performs a NAND operation.

In another embodiment, the voltage compensation unit includes a first switch configured to electrically connect the internal voltage to the first external voltage in response to the select signal, and a second switch configured to electrically connect the internal voltage to the second external voltage in response to the select signal.

In another embodiment, preferably, the select signal generator generates the first select signal having a first level and the second select signal having a second level if the level of the first external voltage is higher than the level of the second external voltage, and generates the first select signal having the second level and the second select signal having the first level if the level of the first external voltage is lower than the level of the second external voltage.

In another embodiment, when the first level is a low level, and the second level is a high level, each of the first and second switches is a PMOS transistor.

In another embodiment, when the first level is a high level, and the second level is a low level, each of the first and second switches is an NMOS transistor.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, examples and embodiments of the present invention will be described with reference to accompanying drawings. However, the examples and embodiments are for illustrative purposes only and are not intend to limit the scope of the disclosure.

Figure 4:
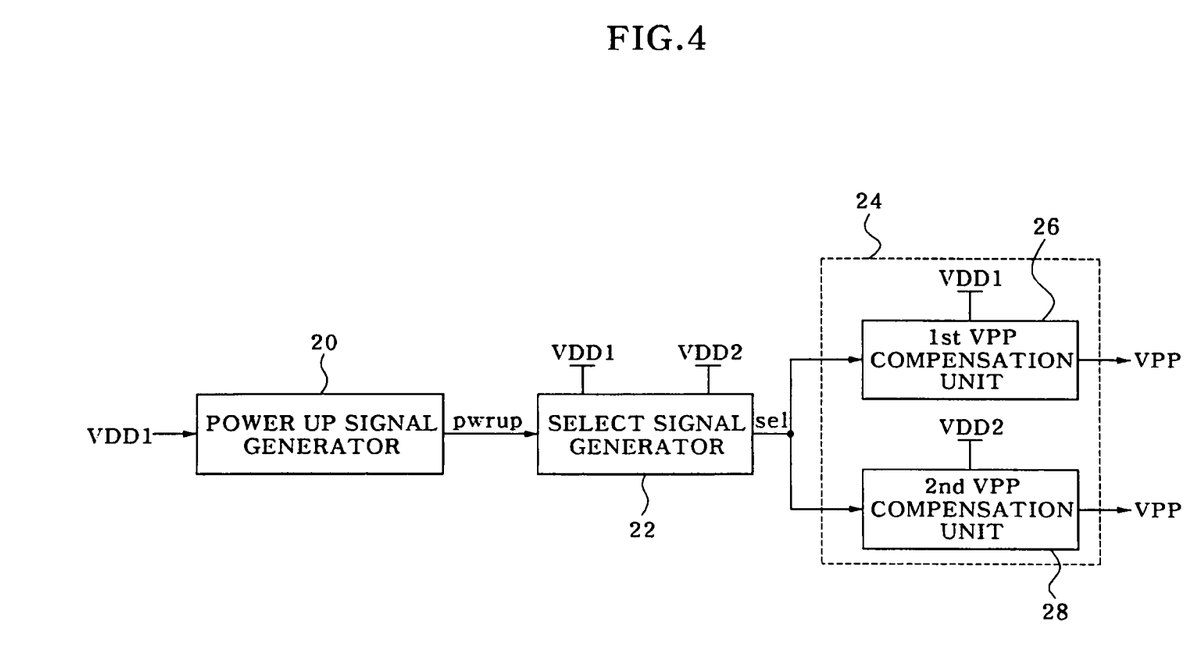
FIG. 4 is a block diagram showing the structure of a high voltage compensation circuit according to a first embodiment of the present disclosure.

FIG. 4 is a block diagram showing the structure of a high voltage compensation circuit according to a first embodiment of the present disclosure.

As shown in FIG. 4, the high voltage compensation circuit according to the first embodiment includes a power up signal generator 20, a select signal generator 22, and a high voltage compensation unit 24. The power up signal generator 20 generates a power up signal pwrup. The select signal generator 22 operates in response to the power up signal pwrup and compares the level of a first external voltage VDD1 with the level of a second external voltage VDD2 to generate a selection signal sel. The high voltage compensation unit 24 responds to the selection signal sel to electrically connect the high voltage VPP to the first external voltage VDD1 or the second external voltage VDD2.

The power up signal generator 20 generates a power up signal pwrup that rises corresponding to the level of the first external voltage VDD1 before the level of the first external voltage VDD1 reaches the level of a target voltage, that is, during a power up section. The power up signal generator 20 generates a power up signal pwrup that is switched from the high level into a low level after the level of the first external voltage VDD1 reaches the level of the target voltage. In another embodiment, the power up signal generator 20 may generate the power up signal pwrup corresponding to the level of the second external voltage VDD2.

Figure 5:
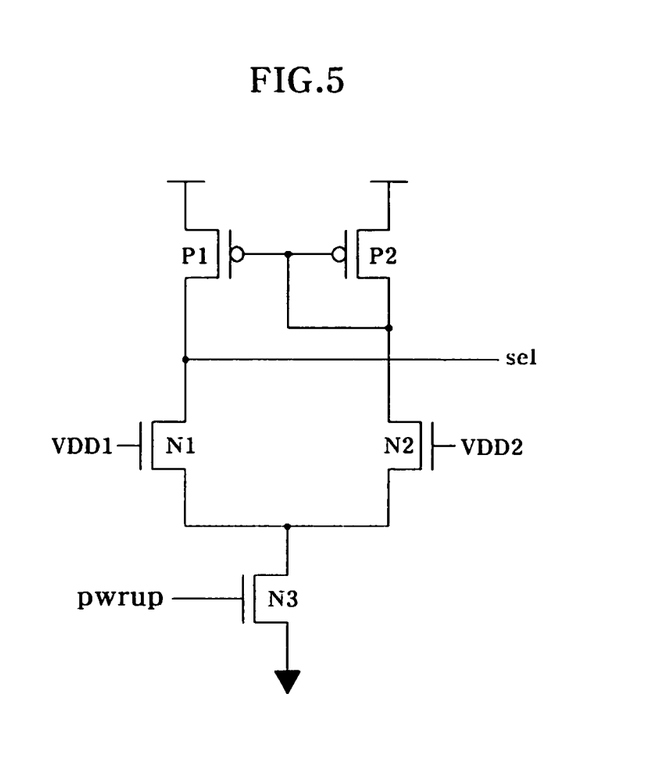
FIG. 5 is a circuit diagram showing the structure of a select signal generator of FIG. 4.

As shown in FIG. 5, the select signal generator 22 includes PMOS transistors P1 and P2, which form a current mirror, NMOS transistors N1 and N2, which receive the first and second external voltages VDD1 and VDD2, respectively, and an NMOS transistor N3, which receives the power up signal pwrup to enable the comparison of the level of the first external voltage VDD1 and the level of the second external voltage VDD2. The select signal generator 22 having the above structure outputs a low-level select signal sel if the level of the first external voltage VDD1 is higher than the level of the second external voltage VDD2. The select signal generator 22 outputs a high-level select signal sel if the level of the first external voltage VDD1 is lower than the level of the second external voltage VDD2.

Figure 6:
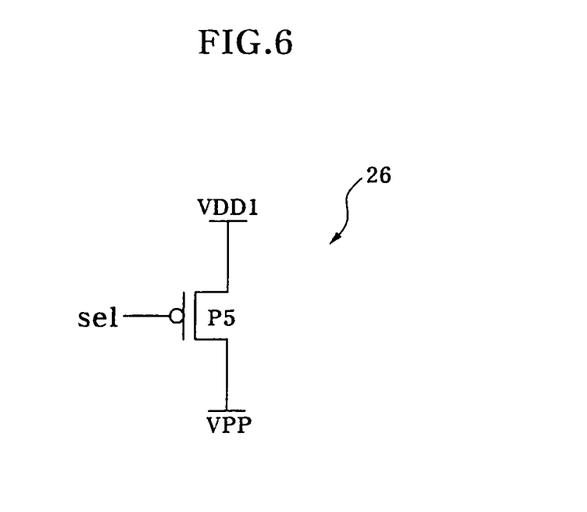
FIG. 6 is a circuit diagram of a first high voltage compensation unit shown in FIG.4.
Figure 7:
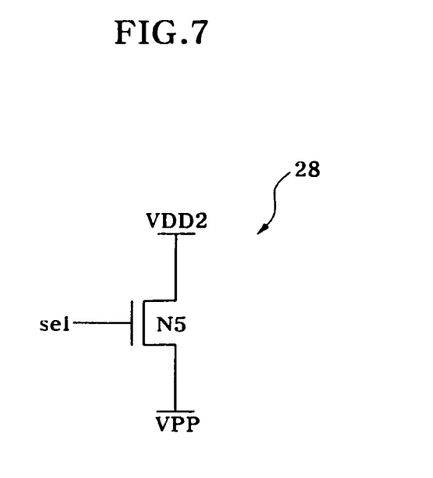
FIG. 7 is a circuit diagram of a second high voltage compensation unit shown in FIG. 4.

The high voltage compensation unit 24 includes a first high voltage compensation unit 26, which responds to the select signal sel to electrically connect the high voltage VPP to the first external voltage VDD1, and a second high voltage compensation unit 28, which responds to the select signal sel to electrically connect the high voltage VPP to the second external voltage VDD2. As shown in FIG. 6, the first high voltage compensation unit 26 includes a PMOS transistor P5 which receives a low-level select signal sel to electrically connect the high voltage VPP to the first external voltage VDD1. As shown in FIG. 7, the second high voltage compensation unit 28 includes an NMOS transistor N5 which receives a high-level select signal sel to electrically connect the high voltage VPP to the second external voltage VDD2. According to another embodiment, the first and second high voltage compensation units 26 and 28 may be realized by using an NMOS transistor, which operates by receiving a high-level select signal sel, and a PMOS transistor, which operates by receiving a low-level select signal sel.

Hereinafter, the operation of the high voltage compensation circuit having the above structure according to the embodiment of FIG. 4 will be described with reference to FIG. 8.

A power up signal pwrup generated from the power up signal generator 20 is maintained in a high level in a power up section except for an initial part of the power up section before the level of the first external voltage VDD1 reaches the level of the target voltage. Accordingly, the select signal generator 22 having received the high-level power up signal pwrup is enabled to compare the level of the first external voltage VDD1 with the level of the second external voltage VDD2 and generate a select signal sel. In other words, the select signal generator 22 outputs a low-level select signal sel if the level of the first external voltage VDD1 is higher than the level of the second external voltage VDD2, and outputs a high-level select signal sel if the level of the first external voltage VDD1 is lower than the level of the second external voltage VDD2.

If the low-level select signal sel is generated, the first high voltage compensation unit 26 operates to electrically connect the high voltage VPP to the first external voltage VDD1. Meanwhile, if the high-level select signal sel is generated, the second high voltage compensation unit 28 operates to electrically the high voltage VPP to the second external voltage VDD2. Accordingly, the high voltage VPP rises corresponding to the first external voltage VDD1 or the second external voltage VDD2 having the higher level in the power up section.

Thereafter, the high level of the power up signal pwrup generated from the power up signal generator 20 is switched into a low level after the level of the first external voltage VDD1 reaches the level of the target voltage. Accordingly, the select signal generator 22 having received the lower-level power up signal pwrup is stopped.

Figure 8:
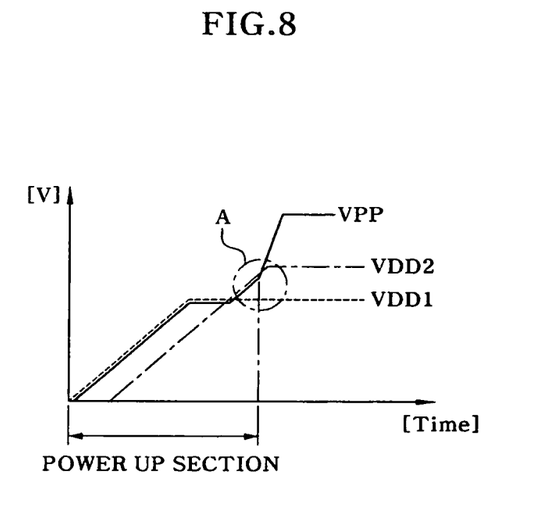
FIG. 8 is a graph showing the waveforms of internal signals of FIG. 4 in more detail.

The waveform of the high voltage VPP generated from the above high voltage compensation circuit according to the embodiment of FIG. 4 is illustrated in FIG. 8. As shown in FIG. 8, when the first and second external voltages VDD1 and VDD2 having different types are input, the high voltage VPP is connected to the first external voltage VDD1 or the second external voltage VDD2 having the higher level, so that it is possible to prevent latch up when the level of the high voltage VPP is lower than the level of the first external voltage VDD1 or the second external voltage VDD2 in the power up section.

Figure 9:
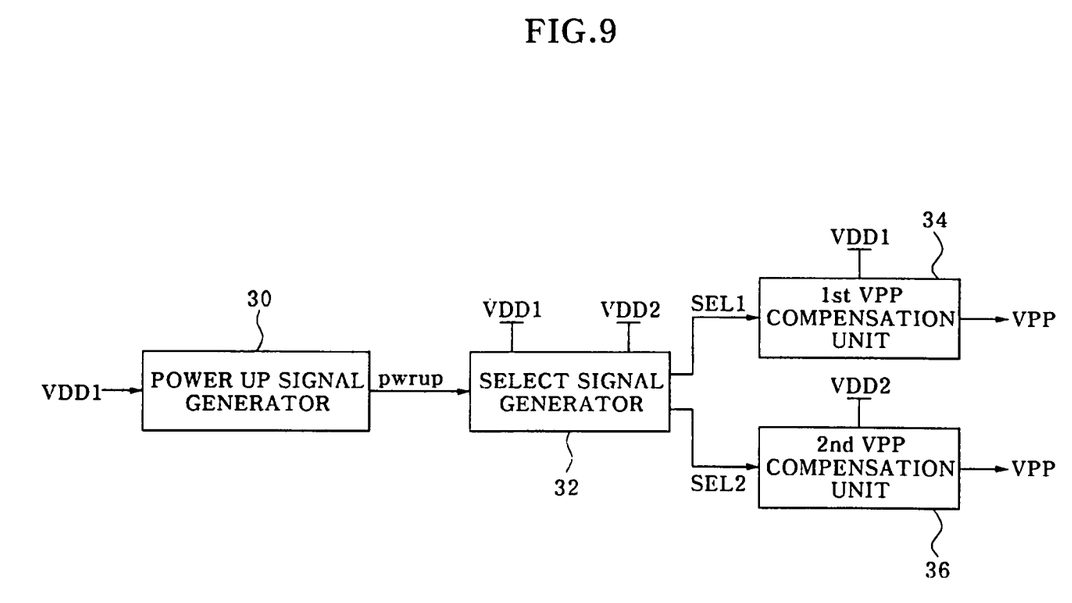
FIG. 9 is a block diagram showing the structure of a high voltage compensation circuit according to a second embodiment of the present disclosure.

FIG. 9 is a block diagram showing a high voltage compensation circuit according to a second embodiment of the present disclosure.

The high voltage compensation circuit according to the embodiment of FIG. 9 includes a power up signal generator 30, a selection signal generator 32, a first high voltage compensation unit 34, and a second high voltage compensation unit 36. The power up signal generator 30 generates a power up signal pwrup. The selection signal generator 32 compares the level of the first external voltage VDD1 with the level of the second external voltage VDD2 to generate a first select signal SEL1 or a second select signal SEL2. The first high voltage compensation unit 34 responds to the first select signal SEL1 to electrically connect the high voltage VPP to the first external voltage VDD1. The second high voltage compensation unit 36 responds to the second select signal SEL2 to electrically connect the high voltage VPP to the second external voltage VDD2. The second external voltage VDD2 is generated in response to the power up signal pwrup.

The power up signal generator 30 generates a power up signal pwrup rising corresponding to the level of the first external voltage VDD1 before the level of the first external voltage VDD1 reaches the level of a target voltage, that is, during a power up section. In addition, the power up signal generator 30 generates a power up signal pwrup that is shifted from the high level into a low level after the level of the first external voltage VDD1 reaches the level of the target voltage. According to another embodiment, the power up signal generator 30 may generate the power up signal pwrup corresponding to the level of the second external voltage VDD2.

Figure 10:
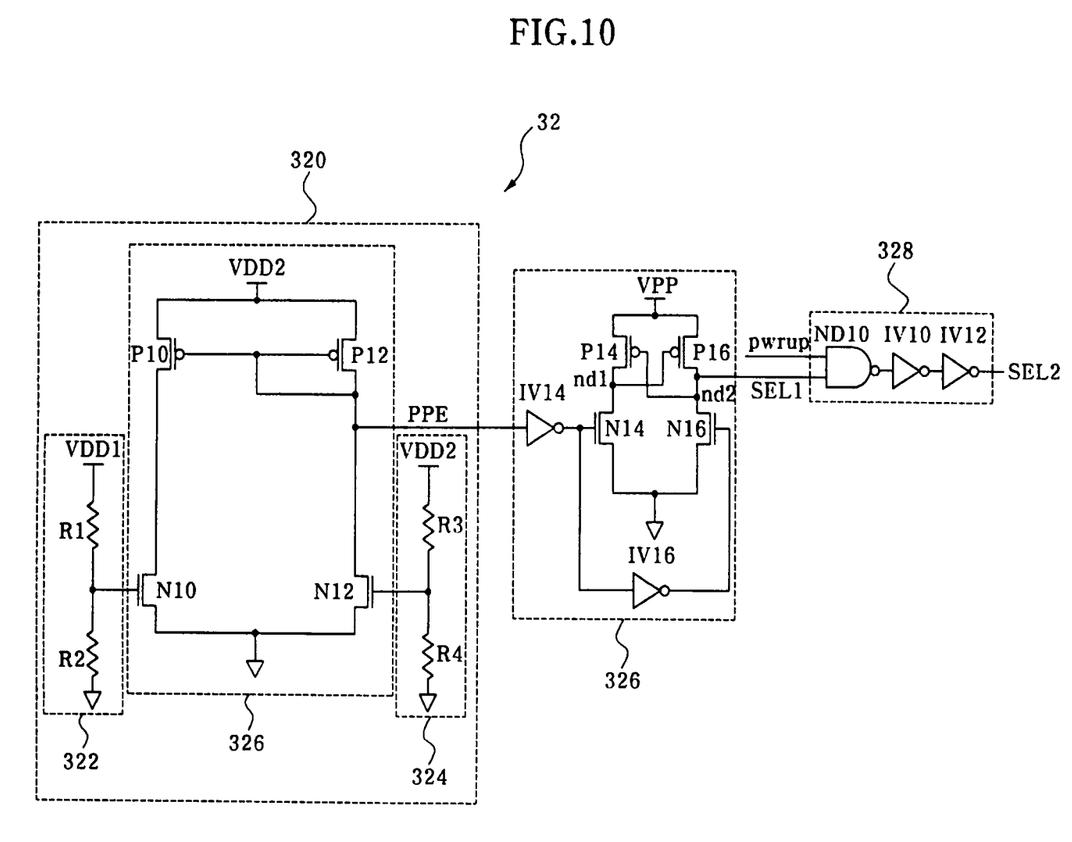
FIG. 10 is a circuit diagram showing the structure of a select signal generator of FIG. 9.

As shown in FIG. 10, the select signal generator 32 includes a comparator 320, which compares the first external voltage VDD1 with the second external voltage VDD2 to generate a comparison signal PPE, a level shifter 326, which level-shifts the comparison signal PPE to generate the first select signal SEL1, and a logic unit 328, which receives the power up signal pwrup and the first select signal SEL1 and performs a NAND operation with respect to the power up signal pwrup and the first select signal SEL1 to generate the second select signal SEL2.

The comparator 320 includes a first voltage divider 322, which includes resistor elements R1 and R2 to divide the first external voltage VDD1, a second voltage divider 324, which includes resistor elements R3 and R4 to divide the second external voltage VDD2, and a differential amplifier 326, which differentially amplify the output signals of the first and second voltage dividers 322 and 324 to generate the comparison signal PPE. In this case, the values of the resistor elements R1, R2, R3, and R4 are preferably set such that the output signal of the first voltage divider 322 is higher than the output signal of the second voltage divider 324 if the first external voltage VDD1 is higher than the second external voltage VDD2.

The level shifter 326 includes NMOS transistors N14 and N16 and PMOS transistors P14 and P16. The NMOS transistor N14 is connected between a node nd1 and a ground terminal and responds to the inverse signal of the comparison signal PPE to pull-down drive the node nd1. The NMOS transistor N16 is connected between a node nd2 and the ground terminal and responds to the comparison signal PPE to pull-down drive the node nd2. The PMOS transistor P14 is connected between a high voltage stage VPP and the node nd1 and responds to the signal of the node nd2 to pull-up drive the node nd1. The PMOS transistor P16 is connected between the high voltage stage VPP and the node nd2 and responds to the signal of the node nd1 to pull-up drive the node nd2.

Figure 11:
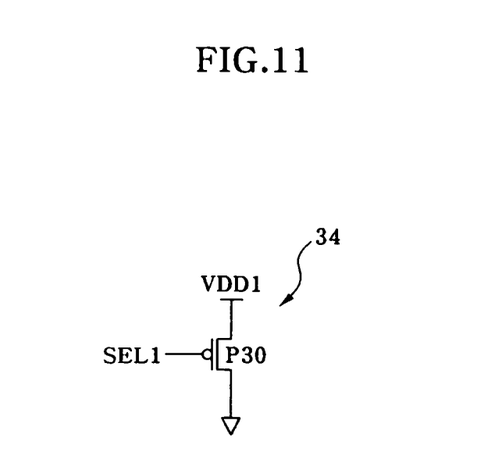
FIG. 11 is a circuit diagram of a first high voltage compensation circuit shown in FIG. 9.
Figure 12:
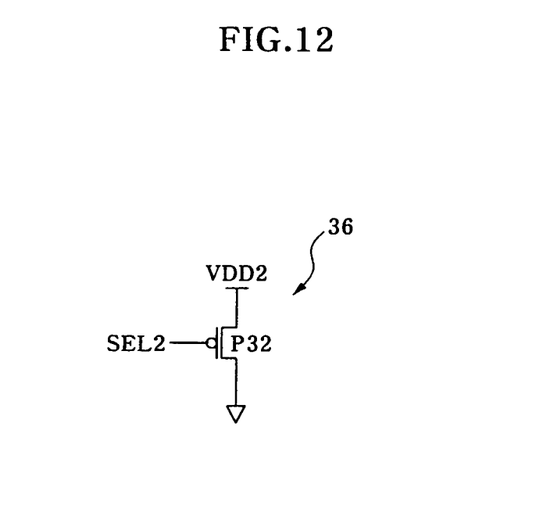
FIG. 12 is a circuit diagram of a second high voltage compensation circuit shown in FIG. 9.

Referring to FIG. 11, the first high voltage compensation unit 34 includes a PMOS transistor P30 which is connected between the first external voltage terminal VDD1 and the ground terminal and turned on in response to the first selection signal SEL 1. Referring to FIG. 12, the second high voltage compensation unit 36 includes a PMOS transistor P32 which is connected between a second external voltage stage VDD2 and the ground terminal and turned on in response to the second select signal SEL2.

Hereinafter, the operation of the high voltage compensation circuit having the above structure according to the embodiment of FIG. 9 will be described with reference to FIG. 13.

Figure 13:
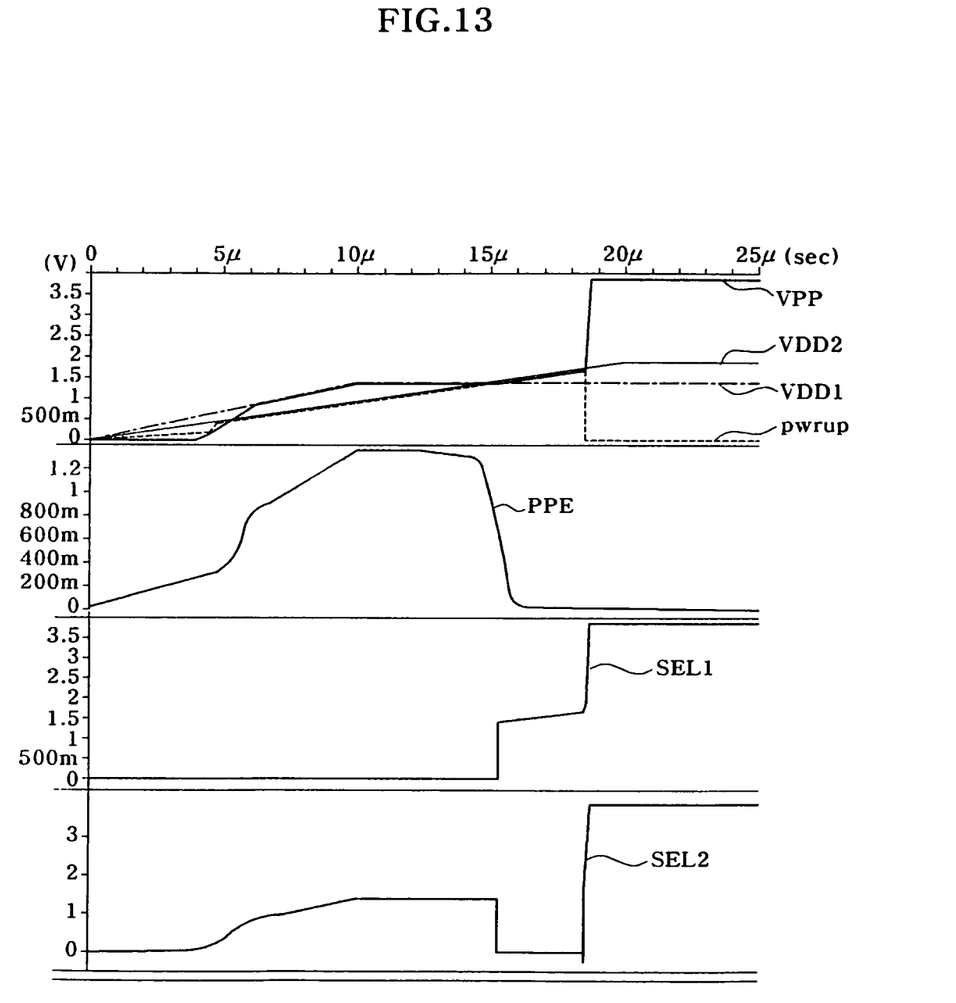
FIG. 13 is a graph showing the waveforms of internal signals of FIG.9.

Referring to FIG. 13, the level of the first external voltage VDD1 is higher than the level of the second external voltage VDD2 before about 15 μsec comes in a power up section. After about 15 μsec elapses in the power up section, the level of the second external voltage VDD2 is higher than the level of the first external voltage VDD1. In addition, after the power up section, that is, about 18 μsec, the level of the first external voltage VDD1 rises to a desired level so that the high level of the power up signal pwrup is shifted into a low level.

The comparator 320 generates a high-level comparison signal PPE in a first section wherein the level of the first external voltage VDD1 is higher than the level of the second external voltage VDD2. The first section refers to a section between 0 μsec to 15 μsec. In other words, since the output signal of the first voltage divider 322 is higher than the output signal of the second voltage divider 324 so that the turn-on degree of the NMOS transistor N10 is higher than the turn-on degree of the NMOS transistor N12, the comparison signal PPE becomes a high level.

The level shifter 326 receives the high-level comparison signal PPE to generate the first select signal SEL1 in a low-level. This is because the high-level comparison signal PPE turns on the NMOS transistor N16 to pull-down drive the node nd2. The level shifter 326 inverts and buffers the input comparison signal PPE to generate the first select signal SEL1.

The first select signal SEL1 having the low-level is input into one end of the logic unit 328. Accordingly, the logic unit 328 generates the second select signal SEL2 having a high level.

As described above, the low-level first select signal SEL1 and the high-level second select signal SEL2 are generated in the first section. Since the low-level first select signal SEL1 turns on the PMOS transistor P30 of the first high voltage compensation unit 34, and the high-level second select signal SEL2 turns off the PMOS transistor P32 of the second high voltage compensation unit 36, the high voltage VPP is electrically connected to the first external voltage stage VDD1. Accordingly, the level of the high voltage VPP rises corresponding to the first external voltage VDD1.

The comparator 320 generates a low-level comparison signal PPE in a second section wherein the level of the first external voltage VDD1 is lower than the level of the second external voltage VDD2, in which the second section refers to a section between 15 μsec and 18 μsec.

The level shifter 326 receives the low-level comparison signal PPE to generate a high-level first select signal SEL1. This is because the low-level comparison signal PPE turns on the NMOS transistor N14 to pull-down drive the node nd1, and turns on the PMOS transistor P16 to pull-up drive the node nd2.

The high-level first select signal SEL1 is input to the first terminal of the logic unit 328. At this time, as shown in FIG. 13, since the power up signal pwrup rises corresponding to the level of the first external voltage VDD1 in the power up section except for the initial section, the high-level first select signal SEL1 is input to the second terminal of the logic unit 328. Accordingly, the logic unit 328 generates a low-level second select signal SEL2.

As described above, the high-level first select signal SEL1 and the low-level second select signal SEL2 are generated in the second section. Since the high-level first select signal SEL1 turns off the PMOS transistor P30 of the first high voltage compensation unit 34, and the high-level second select signal SEL2 turns on the PMOS transistor P32 of the second high voltage compensation unit 36, the high voltage VPP is electrically connected to the second external voltage stage VDD2. Accordingly, the level of the high voltage VPP rises corresponding to the second external voltage VDD2.

Since a high-level power up signal pwrup is shifted into a low-level power up signal pwrup in a third section, in which the third section refers to a section after 18 μsec, the logic unit 328 generates a high-level second select signal SEL2. Accordingly, the PMOS transistor P32 of the second high voltage compensation unit 36 is turned off so that the high voltage VPP is electrically disconnected from the second external voltage terminal VDD2. Since the first external voltage VDD1 rises to a desired level in the third section, the high voltage VPP is electrically not connected to the first external voltage VDD1 or the second external voltage VDD2, but is pumped through a high voltage pumping circuit (not shown). Since the structure of the high voltage pumping circuit is generally known to those skilled in the art, details thereof will be omitted in order to avoid redundancy.

As described above, when the first and second external voltages VDD1 and VDD2 having different types are applied, the high voltage compensation circuit according to the embodiment of FIG. 9 connects the high voltage VPP to the first external voltage VDD1 or the second external voltage VDD2 having the higher level in a power up section, so that it is possible to prevent latch up when the level of the high voltage VPP is lower than the level of the first external voltage VDD1 or the second external voltage VDD2.

The above specific examples and embodiments are illustrative, and many variations can be introduced on these examples and embodiments without departing from the spirit of the disclosure or from the scope of the appended claims. For example, elements and/or features of different examples and illustrative embodiments may be combined with each other and/or substituted for each other within the scope of this disclosure and appended claims.

The present disclosure claims priorities to Korean application numbers 10-2007-0083697 and 10-2008-0006371, filed on Aug. 20, 2007 and Jan. 21, 2008 respectively, the entire contents of which are incorporated herein by reference.

What is claimed is:

1. An internal voltage compensation circuit comprising:
   a power up signal generator configured to generate a power up signal having a level transition after a level of a first external voltage reaches a level of a target voltage;
   a select signal generator configured to compare the level of the first external voltage with a level of a second external voltage to generate a select signal in response to the power up signal, wherein levels of the first external voltage and the second external voltage are increased with a predetermined slope;
   a first switch configured to electrically connect an internal voltage to the first external voltage in response to the select signal; and
   a second switch configured to electrically connect the internal voltage to the second external voltage in response to the select signal.

2. The internal voltage compensation circuit of claim 1, wherein the power up signal generator generates the power up signal in response to the level of the first external voltage or the second external voltage.

3. The internal voltage compensation circuit of claim 1, wherein the select signal generator generates the select signal having a first level if the level of the first external voltage is higher than the level of the second external voltage, and generates the select signal having a second level if the level of the first external voltage is lower than the level of the second external voltage.

4. The internal voltage compensation circuit of claim 3, wherein the first level is a low level, and the second level is a high level.

5. The internal voltage compensation circuit of claim 4, wherein the first switch is a PMOS transistor and the second switch is an NMOS transistor.

6. The internal voltage compensation circuit of claim 3, wherein the first level is a high level and the second level is a low level.

7. The internal voltage compensation circuit of claim 6, wherein the first switch is an NMOS transistor and the second switch is a PMOS transistor.

* * * * *